United States Patent
Bodi (10) Patent No.: US 10,506,745 B2
(45) Date of Patent: Dec. 10, 2019

(54) PROTECTIVE ENCLOSURE SYSTEM

(71) Applicant: Robert Francis Bodi, Westlake, OH (US)

(72) Inventor: Robert Francis Bodi, Westlake, OH (US)

(73) Assignee: Innovation By Imagination LLC, Westlake, OH (US)

( * ) Notice: Subject to any disclaimer, the term of this patent is extended or adjusted under 35 U.S.C. 154(b) by 0 days.

(21) Appl. No.: 16/165,325

(22) Filed: Oct. 19, 2018

(65) Prior Publication Data

US 2019/0124799 A1    Apr. 25, 2019

Related U.S. Application Data

(60) Provisional application No. 62/574,409, filed on Oct. 19, 2017.

(51) Int. Cl.
*H05K 9/00*     (2006.01)
*E04H 15/00*    (2006.01)
*E04H 6/42*     (2006.01)

(52) U.S. Cl.
CPC ............. *H05K 9/0001* (2013.01); *E04H 6/42* (2013.01); *E04H 15/00* (2013.01); *H05K 9/0043* (2013.01)

(58) Field of Classification Search
CPC ...... H05K 9/0001; H05K 9/0043; E04H 6/42; E04H 15/00; E04H 15/54; E04H 15/04
See application file for complete search history.

(56) References Cited

U.S. PATENT DOCUMENTS

| | | | | |
|---|---|---|---|---|
| 144,193 A * | 11/1873 | Elliot | ...................... | E04H 15/04 135/90 |
| 447,842 A * | 3/1891 | Partridge | ................ | E04H 15/04 135/90 |
| 653,993 A * | 7/1900 | Forry | ...................... | E04H 15/04 135/90 |
| 844,220 A * | 2/1907 | Westbrooke | ............ | E04H 15/04 135/90 |
| 969,899 A * | 9/1910 | Partington | .............. | E04H 15/04 135/90 |
| 2,793,245 A * | 5/1957 | Dunn | .................... | H05K 9/0001 174/373 |
| 3,217,085 A * | 11/1965 | Lindgren | .............. | H05K 9/0001 174/371 |
| 3,463,174 A * | 8/1969 | Heller | ...................... | B60J 11/00 135/143 |
| 4,308,882 A * | 1/1982 | Pusch | ...................... | E04H 15/54 135/87 |
| 5,436,803 A * | 7/1995 | Annis | .................. | H05K 9/0043 361/818 |
| 8,640,395 B2 * | 2/2014 | DiSabantonio, III | ... | E04C 2/322 135/117 |
| 8,733,380 B1 * | 5/2014 | Roberts | .................... | B60J 11/04 135/120.4 |

* cited by examiner

*Primary Examiner* — Noah Chandler Hawk
(74) *Attorney, Agent, or Firm* — Bodi Law LLC (57) ABSTRACT

A protective enclosure having a flexible outer wall including a conducting layer and an insulating layer and having a closable opening for protecting a vehicle from damaging electromagnetic fields. Also, the method of using the protective enclosure to protect vehicles or other devices from damage by electromagnetic fields.

20 Claims, 6 Drawing Sheets

PROTECTIVE ENCLOSURE SYSTEM

CROSS-REFERENCES TO RELATED APPLICATIONS

This application claims priority from U.S. provisional patent application Ser. No. 62/574,409 filed on Oct. 19, 2017, and incorporated herein by reference.

BACKGROUND

Various societies around the world have become more and more dependent upon electrical equipment for industry and personal lives. Furthermore, this electrical equipment has become more and more complicated, with more and more devices utilizing sensitive electronics, such as computers for control and operation functions.

This electrical equipment can be overly sensitive to electrical fields, such as may be created by lightning or even solar events such as solar flares or sunspots. Furthermore, modern warfare techniques anticipate the use of Electrical Magnetic Pulse (EMP) weapons that can impact electrical equipment over large geographical areas. The electronics and wiring in electrical equipment can be seriously damaged or even destroyed by exposure to electromagnetic fields of sufficient strength such as may be created by the listed events, among others. Electrical transmission grids themselves are vulnerable to these events, since the long transmission lines and wire coils of transformers act as antenna for such fields, and hence can be adversely impacted by them.

Furthermore, electronic surveillance utilizing electromagnetic fields is also becoming a risk for those who desire to keep the communications and information confidential.

Desired are devices and methods to protect equipment from damage if and when such events occur. Also desired is a means to combat electronic surveillance.

SUMMARY

Provided are a plurality of example embodiments, including, but not limited to, embodiments of various conductive bags provided in various arrangements to protect an interior of the bags from electromagnetic fields, thereby acting similar to a faraday cage.

Also provided is a protective storage system for a vehicle comprising: a flexible outer wall configured to form an inner chamber sized to receive the vehicle, the flexible outer wall including: a flexible inner layer comprising an insulator, and a flexible conducting layer comprising a conductor configured to dissipate an electric field; a base configured to spread a bottom portion of the flexible outer wall to form a horizontal shape of the inner chamber; a mounting structure configured to hold a portion of the flexible outer wall above the base to form a vertical shape of the inner chamber.

The flexible outer wall is configured with a closable opening at one end such that the inner chamber protects the vehicle inside the chamber from damage by the electric field when the opening is closed.

Further provided is a protective storage system for a vehicle comprising:

a flexible outer wall configured to form an inner chamber sized to receive the vehicle, the flexible outer wall including: a flexible inner layer comprising an insulator, a flexible conducting layer comprising a conductor configured to dissipate an electric field, and a flexible outer layer comprising an insulator; a base configured to spread a bottom portion of the flexible outer wall to form a horizontal shape of the inner chamber; a mounting structure configured to hold a portion of the flexible outer wall above the base to form a vertical shape of the inner chamber, the mounting structure including a spreader for spreading a top of the flexible outer wall to form an upper portion of the chamber.

The flexible outer wall is configured with a closable opening at one end such that the inner chamber protects the vehicle inside the chamber from damage by the electric field when the opening is closed.

Still further provided is a of protecting a vehicle from an electromagnetic field, comprising the steps of:

providing a protective storage system for a vehicle as disclosed herein;

placing the vehicle within the chamber;

closing the opening of the protective storage system; and protecting the vehicle from the electromagnetic field while the vehicle is within the chamber.

Also provided are additional example embodiments, some, but not all of which, are described hereinbelow in more detail.

BRIEF DESCRIPTION OF THE DRAWINGS

The features and advantages of the example embodiments described herein will become apparent to those skilled in the art to which this disclosure relates upon reading the following description, with reference to the accompanying drawings, in which.

DETAILED DESCRIPTION OF THE EXAMPLE EMBODIMENTS

A faraday cage is a device that shields, and hence protects, an interior space from exposure to electrical fields. A faraday cage also prevents electrical fields from exiting the cage, potentially protecting against undesired external access to such fields, which could be used to gain information (e.g. by electronic surveillance), for example. A faraday cage is basically a chamber that is entirely surrounded by electrically conducting material that prevents the entry (and exit) of electromagnetic fields into (or out of) the chamber interior.

A protective storage system can be created using the principles of a faraday cage by providing a protective enclosure for protecting a device provided within the enclosure. Note that the protective enclosure need not necessarily operate as a perfect faraday cage to protect devices put within the enclosure. Merely by attenuating dangerous electromagnetic fields adequately to avoid damage or surveillance is sufficient. Furthermore, the protective enclosure need not protect against all electromagnetic fields to be effective, since some electromagnetic fields are more likely to occur in dangerous levels, such as the fields created by a natural EMP event (such as may occur by a solar flare, for example), or a man-made EMP event (such as might be created by the detonation of a nuclear device or an EMP generator, for example). Also, the emitted electronic fields that can be monitored are of limited extent.

A conducting bag can be used to form a protective enclosure that operates similar to a faraday cage. Such a bag contains a layer of conducting material throughout the bag, such that there are no gaps, or sufficiently small gaps, between the conducting material to prevent the entry (or exit) of potentially damaging electromagnetic field strengths into the interior (or exterior) of the bag. Note that the interior need not be protected from all electromagnetic fields to be effective; attenuating dangerous electromagnetic fields to below a damaging magnitude can suffice.

For example, anti-static bags that are often used to protect circuit boards, hard drives, and microprocessor devices are sufficiently conductive to bleed off external or internal static electrical charges that could damage the equipment being protected by the bag. Similarly, large conducting bags can be provided which protect larger equipment from electromagnetic fields, and not just static charges.

Figure 5A:
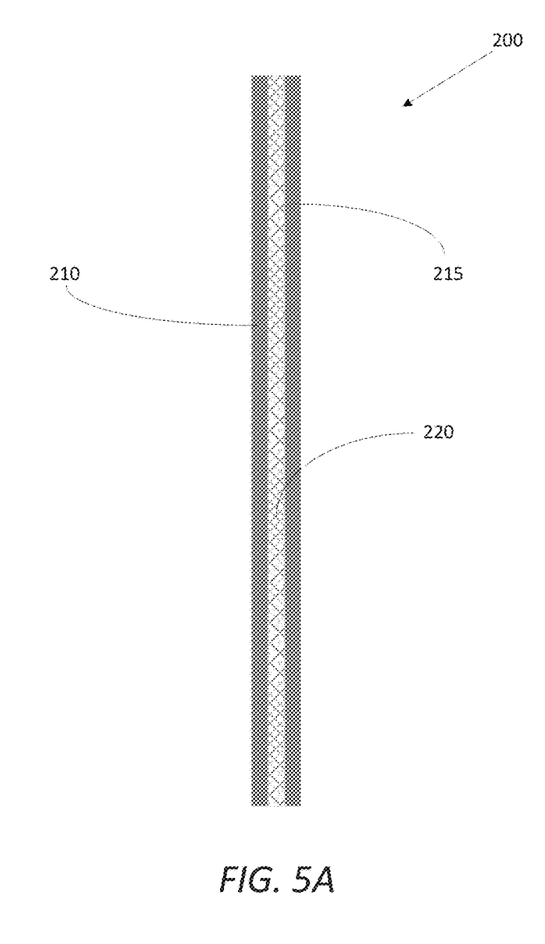
FIGS. 5A and 5B are drawings showing example layers for an example wall for any of the example embodiments.

As a precursor to forming a faraday bag, a faraday sheet 200 can be provided that uses laminated layers of material, such as shown in FIG. 5A. The sheet 200 is comprised of an inner electrically conducting layer 220 sandwiched between an inner insulating layer 215 and an outer insulating layer 210. The inner and outer layers 210, 215 can be comprised of an insulating material of relatively high strength, such as a thin flexible plastic or mesh, woven cloth, rubber, or other materials. The layers 210, 215 may be comprised of the same material, or different material. For example, in some cases it may be desirable to have the inner or outer layer stronger and thicker than the other layer, or the outer layer 210 may be decoratively designed, for example, or made paintable.

As an alternative, the outer layer 210 may be comprised of one or more layers of anti-ballistic material to protect against projectiles, such as bullets (e.g., make it bullet-proof). Acceptable materials may include a fabric, sheet, layer, or fibers of a high-density polymer (e.g., polyethylene, Tensylon), ceramic, metal (e.g., steel, titanium, and alloys thereof), aramid fiber (e.g., Kevlar), polycarbonate (e.g., Lexan), fiberglass (e.g., ArmorCore, see www.armorcore.com), carbon fibers, and other carbon structures, boron treated cloth, etc. and combinations thereof. In such a case, the bag could become a place of refuge if a person or location is under attack, for example, if provided with an appropriate air supply or quantity of air, or made permeable to air. Similarly, the device(s) contained by the bag can be protected from damage and/or surveillance.

In particular, the inner insulating layer 215 that will face the device to be protected should be electrically insulating to avoid any chance that static charges that might form on the conducting layer from electromagnetic fields are discharged into the device, potentially damaging the device. Note that there may be more than 3 layers provided for some embodiments of such faraday sheets, and in some embodiments an inner insulating layer may be provided that is different than an outer layers. Even 2 layers sheets, with the conductive layer being an outer or inner layer could be provided. In particular, where the devices to be protected are already sufficiently insulated, an inner insulating layer may not be needed.

Figure 5B:
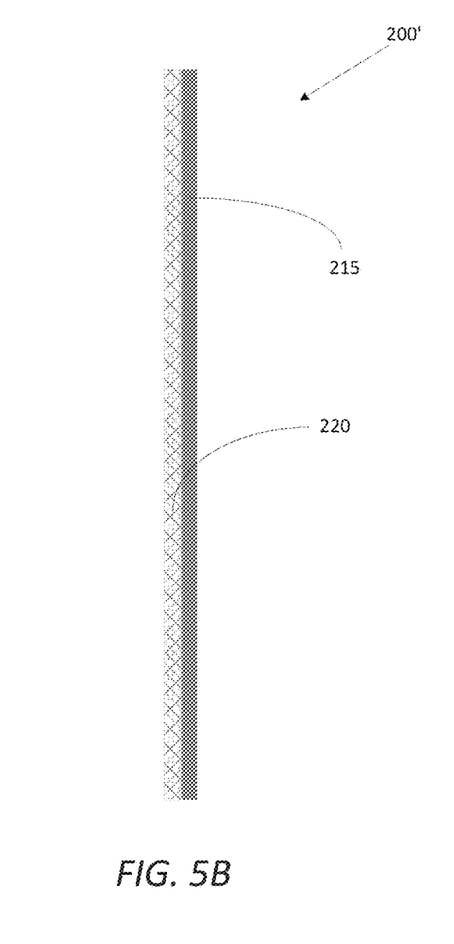

Alternatively, a sheet 200' with two layers may be provided, with an inner insulating layer 215 and an outer conducting layer 220. In some cases, use of a sheet 200' with an outer conducting layer 220 may prove more practical, since the easy access to the conductive layer may make ensuring continuous conductivity across a resulting bag easier. But as pointed out above, in some situations it may be the inner layer that is the conducting layer.

A means of grounding the bag may be provided on the bag by providing a lead or tab connected to the conducting layer 230 for connecting to ground. Providing a ground can prevent static electrical charges from accumulating on the bag. Such charges could threaten the internal device when removed, or could provide potential shock to a person that comes in contact with a charged bag.

The conductive layer 220 can be comprised of any type of conductive material that is somewhat flexible. For example, metal foils or woven metal or other conductive cloths could be utilized. Appropriate metals include relatively efficient conductors like copper, aluminum, or silver, for example. Furthermore, less conductive metals like stainless steel could also be used. Various forms of carbon can also be used, such as carbon fibers or powders, or conductive plastics or other materials.

The conductive layer 200 could be comprised of sheets of metal fibers (such as stainless steel, copper, or aluminum) that are woven into a mesh or cloth that act as a continuous conductor in two dimensions. Preferably, the material will selected to reduce the chance that corrosion may interfere with electrical conductivity between individual fibers, and hence materials like stainless steel or carbon might be particularly desirable for use.

Alternatively, mesh metal screens might be utilized where the gaps between metal wires are sufficiently small to block the transmission of electromagnetic frequencies that are desired to be protected against. In such cases, the gaps should be smaller than the wavelengths of the protected frequencies. Typically, these gaps should be in the low millimeter range, or less, to protect against realistic EMP events. Note that protections for surveillance might utilize larger gaps where longer wavelengths are utilized.

As a further alternative, short fibers of conductive material may be arranged in an overlapping manner with small or non-existent gaps between the fibers, such as the manner provided in fiberglass insulation. Alternatively, conductive powders (such a carbon or metal powder) might be sprayed or glued onto one or both outer layers to provide a continuous conductive surface. Metal or other conductive foils might also be used, which may be sufficiently flexible in thin layers. By laminating multiple layers of such foils, a durable and effective conducting laminate may be provided, in some cases glued together using a conductive adhesive, for example.

The faraday sheet 200, 200' can then be formed into a bag, with an opening at one end and with the other ends sealed forming an inner chamber with one opening. Such a bag may have the inner conductor layers electrically connected together at the meeting ends (by use of overlaps or conducting strips or wires, for example), or where the gaps between the adjacent conducting layers is sufficiently small, no such connection may be necessary.

Note that the conducting layers of the ends might be electrically connected using a conducting tape, solder, or conductive adhesive, or merely through contact, by removing adjacent layers 210 of the opposite ends so that the conducting layers 210 of the opposite are put into conductive contact with each other. In some cases, merely heating the ends sufficiently to provide a spot-weld effect may be sufficient to burn or melt off the non-conducting layers so that the conducting layers connect with each other. Or a metallic strip or foil might be provided between and along the adjacent opposing end layers and then heated by an iron or other heating device to complete the electrical conduction of the adjacent conducting layers. Openings can be electrically sealed using conducting closures, such as metallic zippers or conducting Velcro, for example, or overlapping conducting layers.

Figure 6A:
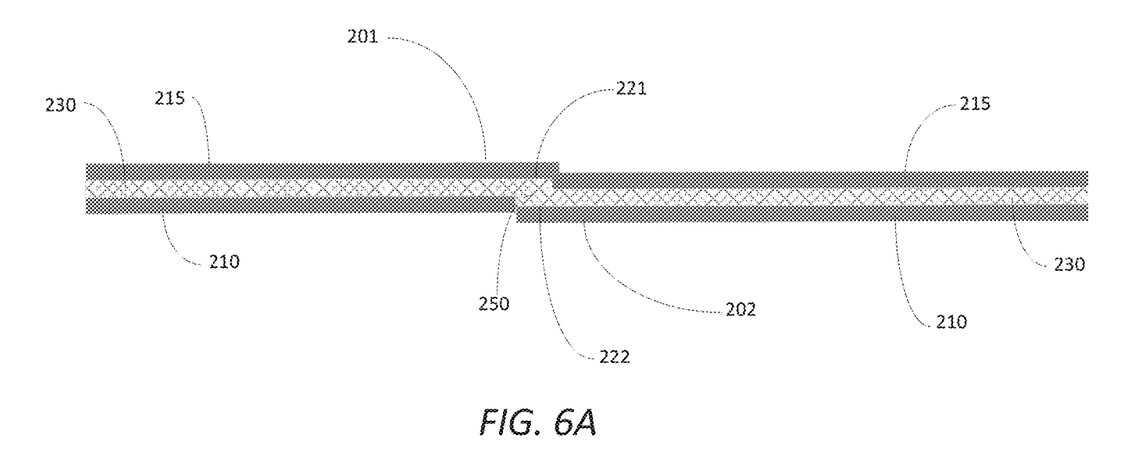
FIGS. 6A and 6B are drawings showing example overlaps of the example layers of FIGS. 5A and 5B, respectively.

For example, FIG. 6A shows two edges 201, 202 of different ends of a faraday sheet 200 being formed into a bag by connecting the conductor layer ends 221, 222 at overlap 250, completing the electrical connection. To provide this connection, some of one of the inner 215 layer of one end should be removed while some of the outer layer 215 of the other end must be removed to expose ends 221, 222 of the conductor layer 230 of each edge 201, 202 for overlap and electrical connection at point 250.

Alternatively, the ends 201, 202 could be overlapped and then heated to melt or burn away portions of the respective layers 215, 210 to put the opposite ends of the conductive layer 230 into electrical contact. In this case, the inner layer 215 may be painted or taped in some manner in case some portion of the conductive layer is exposed in the interior of the bag to ensure full insulation within the bag.

Figure 6B:
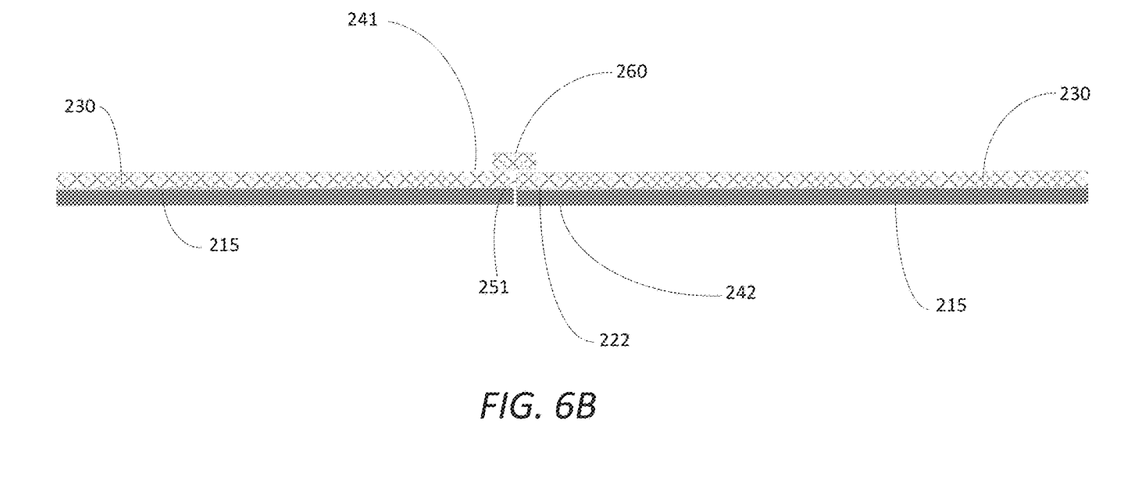

Alternatively, FIG. 6B shows two edges 241, 242 of different ends of a faraday sheet 200' being formed into a bag by connecting the conductor layer 230 at overlap 251 to put the opposite ends of the conductive layer 230 in electrical contact. A conductive strip or tape 260 may be added to ensure completing the electrical connection. Alternatively, the ends 241, 242 could be overlapped and then heated to melt or burn away portions of the insulating layer 215 to put the opposite ends of the conductive layer 230 into electrical contact.

Finally, a further alternative is to construct faraday bags in one piece by forming the inner and/or outer layers using techniques such as blowing or other means of creating bags. The conductive layer may be deposited using a painting process, a vapor deposition process, a plating process, or by creating a separate conductive bag of the same dimensions and then laminating it in or onto a respective insulating bag. 3D printing processes may be utilized, creating each layer in a sequential process. In any case, it is desired that an inner insulating layer be provided for any resulting faraday bag.

Figure 4:
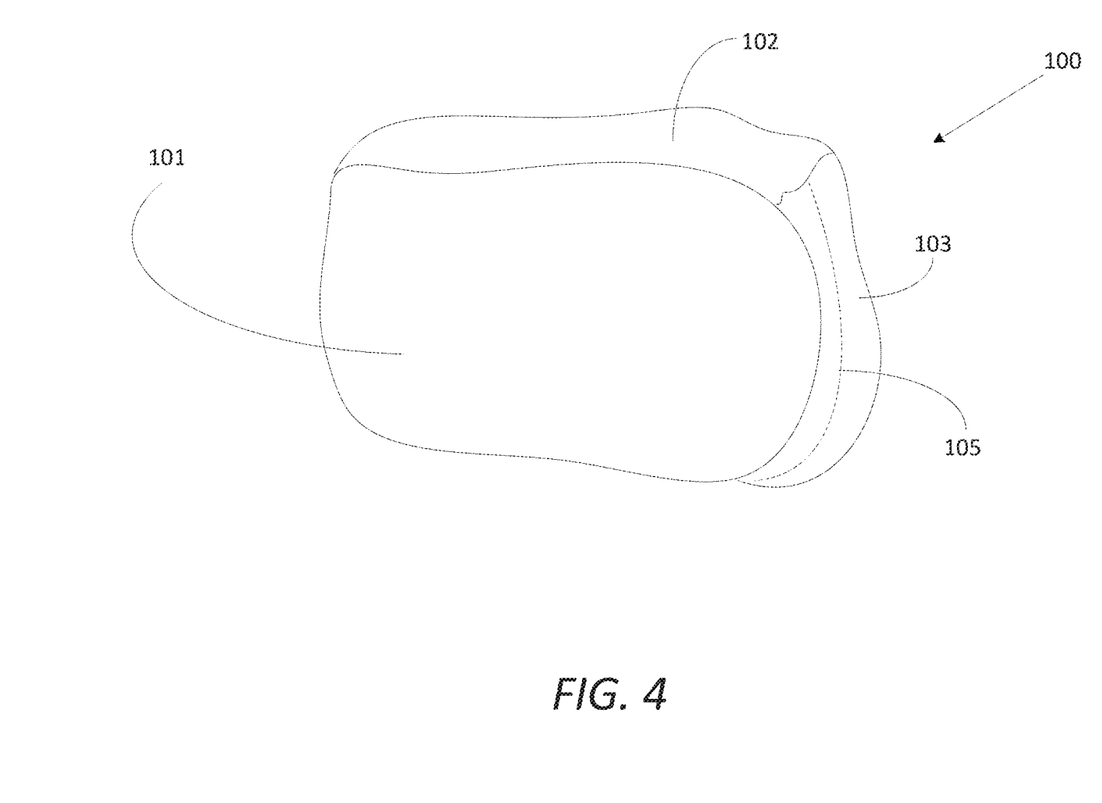
FIG. 4 is a drawing of an example bag that can be used for a protective enclosure for any of the example embodiments.

FIG. 4 shows a perspective of an example faraday bag 100 that can be formed using the faraday sheet 200. The bag has a side portion 101, a top portion 102, and a front portion 103 with an opening portion 105 that is shown sealed closed using a zipper or some other sealing component, such as Velcro. The zipper or Velcro may be conductive and in contact with the inner conducting layers of the sheet 200 to ensure that any electrical gaps are minimized in the resulting bag. Note that the bag need not be of a uniform size, but instead may be provided such that it is wider in a mid portion than at front or back portions. Furthermore, the bag should be sized to accept a solid base portion to form an inner chamber, while being sealed in the back portion and being sealable in the front portion such that a closable opening for receiving items can be provided in the front portion. Additional openings, sealable or not, might be provided for additional access to the inner chamber.

Figure 3:
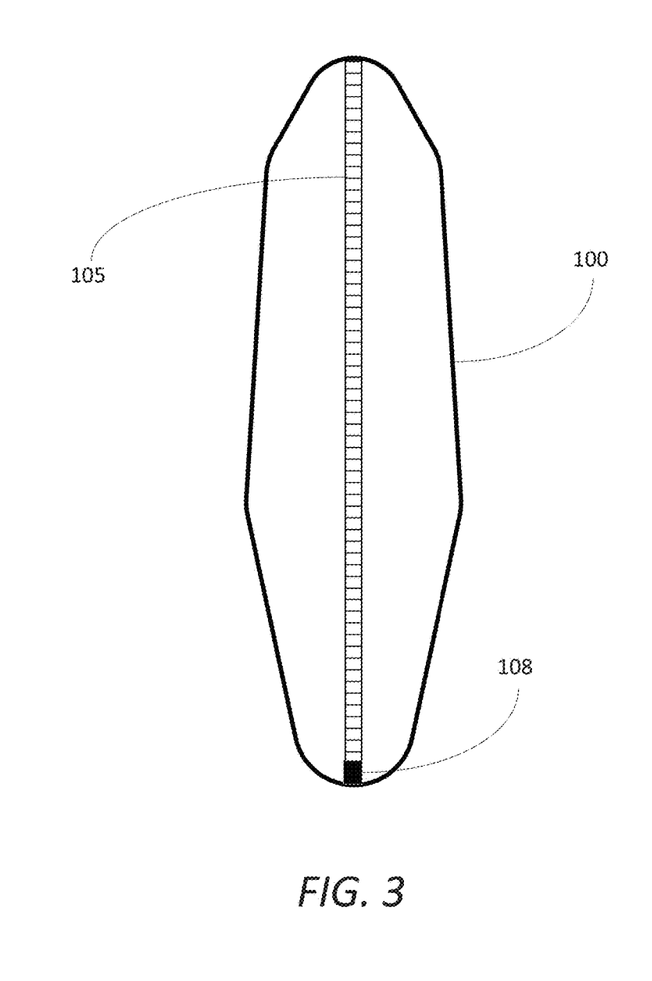
FIG. 3 is a drawing of an example closable opening for any of the example embodiments shown in the closed state.

FIG. 3 shows a front view cutaway of the bag 100 with the opening 105 in the front portion of the bag 100 is shown in a closed state by using zipper 108. The zipper 108 may be comprised of a conductive material provided in contact with the conductive layer of the bag, to ensure electrical conductivity across the opening of the bag. The inner portion of the zipper 105 may be coated with an insulating material, such as paint or a plastic coating, for example, to keep the interior of the bag 100 insulated, but it is noted that it is preferable if the teeth of the zipper be at least partially in conductive contact with opposing teeth to ensure continuous electrical conductivity.

Alternatively, one or more flaps exposing the conducting layer may be provided on the front that overlaps a side of the bag 100 and is sealed using Velcro or some other means. In some cases, the conducting layer need not be exposed, where the mere overlap provides sufficient protection. In a situation where the outside of the bag 100 is conductive, the flap could be provided in an inverted manner such that the interior of the flap is the conductive portion (or has a conductive portion overlapping it) so that the flap is put into conductive contact with the overlapping portion of the bag, in order to support electrical contact. A strap or Velcro can be used to hold the flap in place. An interior flap (which may be provided on the opposite side as the conductive outer flap) can be provided to ensure that the interior stays insulated from the conductive portion of the bag. Alternatively, the inner conductive portion of the outer flap may be pulled over sufficiently that no portion of the conductive portion is exposed to the bag interior. Where the opening can be closed for long term storage, a conductive tape or electrical solder or weld might be used.

Figure 1:
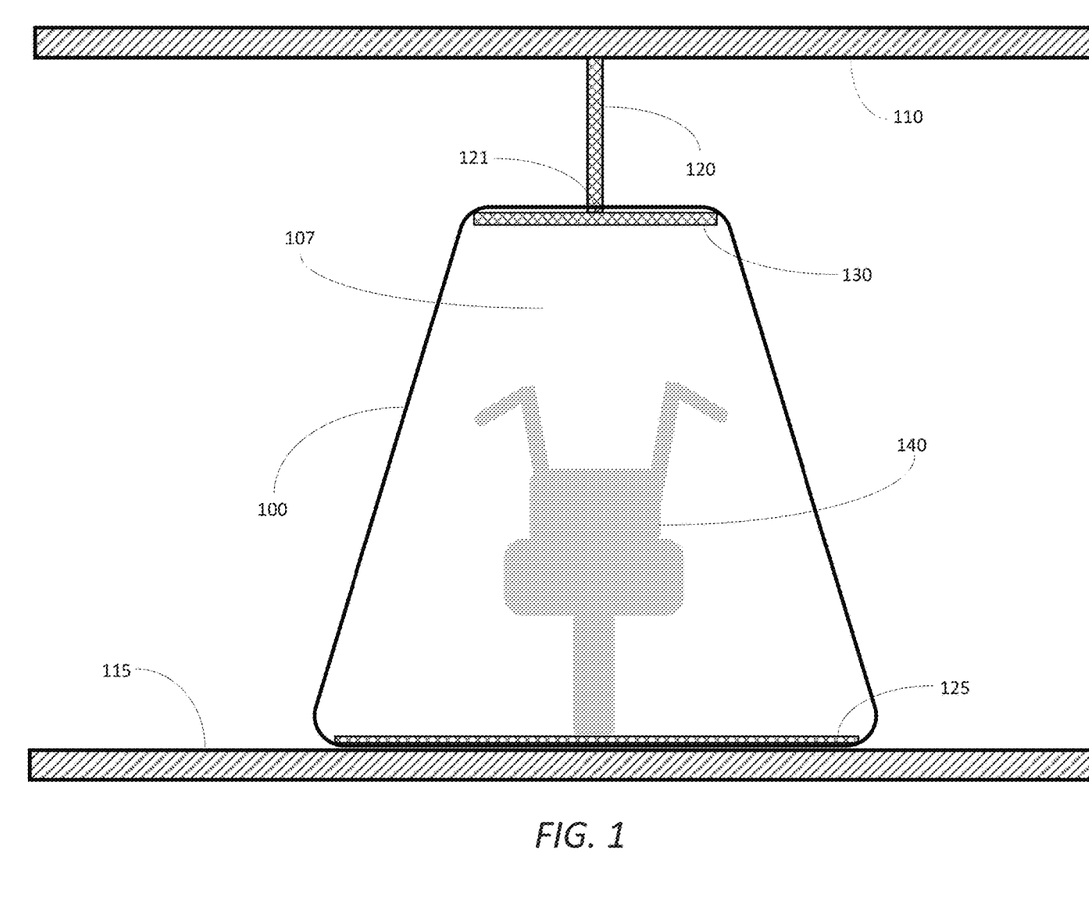
FIG. 1 is a drawing of a first example embodiment of a protective enclosure.

FIG. 1 shows a faraday bag system 10 displaying a cross-section of a faraday bag 100 that is configured for storing a vehicle 140 (e.g. a motorbike or automobile or ATV) in an interior chamber 107 of the bag 100 within a garage, shed, or other building, for example. One or more hangers 120 hang from the ceiling 110 of the garage and penetrates the bag 100 at a respective penetration point(s) 121. The hanger 120 may be comprised of a board or tube or pipe or even a strap or rope hanging from the ceiling 110. Or the hanger might be comprised of a conductive material that provides a ground point and ensure electrical continuity at the penetration point 121.

A spreader 130 is provided in an interior of the bag connected to the hanger(s) 120. The spreader 130 may be a flat board or panel, or a frame (e.g., PVC pipe) provided in a horizontal plane along the length of the bag 100 of sufficient width and length to spread out the top of the bag 100 sufficiently to form the inner chamber 107 to receive the desired vehicle 140. For example, if the vehicle is a motorcycle, the spreader 130 would be at least about the length of the motorcycle, and at least about the width of the motorcycle, for example.

The spreader 130 can be similarly modified for use with any other vehicle, such as an automobile, golf cart, tractor, all terrain vehicle, etc. with dimensions proper to ensure that the chamber 107 is of sufficient size to receive the intended vehicle 140 (or other device). The spreader 130 may be comprised of a wooden board, such as a sheet of plywood, or a plastic panel, or frame, or some other material that is sufficiently stiff to maintain its shape within the bag 100.

Alternatively, the spreader 130 could be provided outside of the bag 100 with the bag 100 being attached to the spreader 130 using adhesive or some other means of connection, such as staples, nails, or screws, for example.

A platform 125 is provided at the bottom of the bag 100, either in the interior of the bag 100, or an exterior of the bag, to form a rigid base. If provided in the interior chamber 107 of the faraday bag 100 as shown, it may merely rest on the bottom of the bag, or it may be connected to the bottom of the bag by an adhesive, for example. If provided on an exterior of the bag 100, the bag 100 should be connected to the platform 125 by an adhesive or some other connecting component such as staples, nails, or screws, for example, in order to ensure that the bottom of the bag is spread out as desired.

The platform 125 is preferable about the same length as the spreader 130, or a bit longer, and preferably wider than the spreader 130 to allow for a user of the vehicle 140 to enter and leave the bag 100 for moving the vehicle 140 in and out of the bag 100. Also, the wider width of the platform 120 ensures that the bag remains clear of the vehicle 140. The platform 125 is preferably thin to allow easy entry and egress of the vehicle 140, and could be made of a wood, such as a plywood board, or a plastic panel, or some other material. A metallic or plastic frame, such as of PVC pipe or flat metal bars could be used to form the platform, which then may not need an interior portion. Such a frame might be permanently installed in the bag 100, or maybe assembled or disassembled as needed.

The front of the faraday bag 100 would be provided sufficiently beyond the vehicle 140 (and in some cases beyond the platform 125) to allow it to overlap on the front to be closed, such as by a zipper or a Velcro device, for example, or using an overlapping flap as described above (such as shown in FIG. 3).

Figure 2:
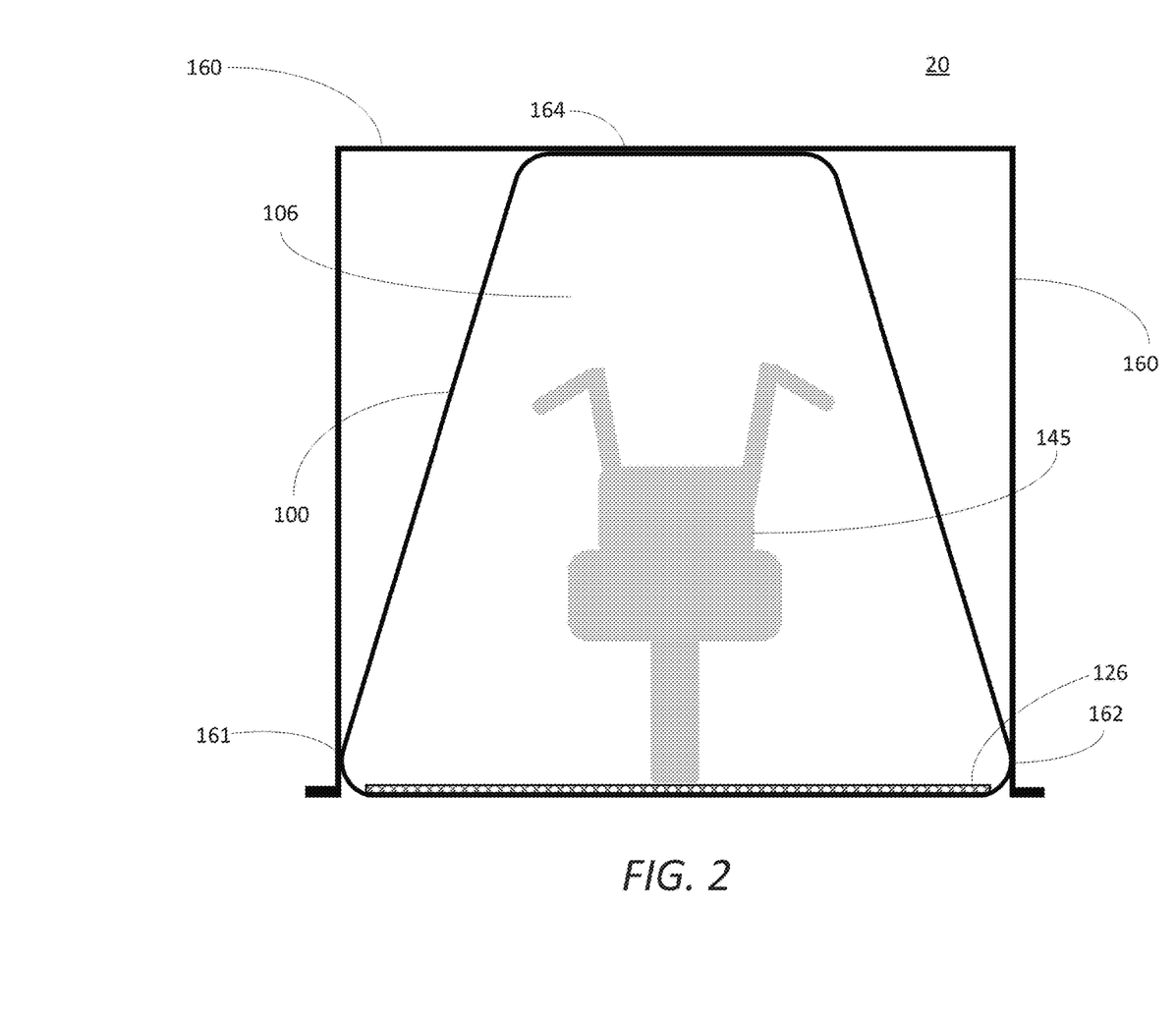
FIG. 2 is a drawing of a second example embodiment of a protective enclosure.

FIG. 2 shows an alternative faraday bag system 20 where a frame 160 is provided to hold the bag 100. The bag 100 is connected to the frame at connection points 161, 162 at the base, and one or more connection points 164 at the top of the frame to act as a spreader.

The frame 160 may be formed into a box along the length of the bag 100, comprised of side walls and a top wall to form a hollow box for holding the bag 100 in a shape to form a hollow chamber 106 to hold a vehicle 145. The walls could be constructed of wood (e.g., plywood sheets or wooden boards), or plastic panels, metal sheets, plastic pipes or bars, a metal frame, or some other materials.

Alternatively, the frame 160 may be comprised of a plurality of upside down U shaped ribs that are spaced apart along the bag 100. The ribs could be comprised of tubes or pipes of metal or plastic (e.g, PVC) formed into the upside U shape which hold the bag in position using a plurality of respective connection points to form the chamber 106 for storing the vehicle 145. Spacers may be provided between the individual ribs of the frame 160 to space them apart the desired distances.

Although the system 20 is shown with the frame 160 provided external to the bag 100, an alternative approach is to put the frame 160 in an interior of the bag 100. In such an approach there may be no need to physically attach the bag 100 to the frame 160, as the frame 160 will expand the bag without such physical connection by proper placement of the frame 160. The frames may be able to be easily assembled and disassembled to aid in mobility and storage of the system.

The system 20 may be provided in a garage, or in an outside environment to protect the vehicle 145. A platform 126 may be provided similar to the platform 125 provided in system 10 to form a base to ensure that the bottom of the bag 100 remains flat for ease of entry and egress of the vehicle into and out of the bag 100.

Although the system 10 and 20 are shown for storing a vehicle (such as an ATV, motor bike, automobile, etc.), such systems can also be used to store many different types of devices for protection from damaging electromagnetic fields. Such devices include, but are not limited to, generators, electrical transmission equipment (e.g., transformers), photovoltaic systems, battery stations, communications stations (e.g., radio transceivers), computer systems, etc. These systems could be adapted by putting shelving or other storage devices in the inner chambers for storing and protecting various equipment and devices such as computers, radios, televisions, etc.

Many other example embodiments can be provided through various combinations of the above described features. Although the embodiments described hereinabove use specific examples and alternatives, it will be understood by those skilled in the art that various additional alternatives may be used and equivalents may be substituted for elements and/or steps described herein, without necessarily deviating from the intended scope of the application. Modifications may be necessary to adapt the embodiments to a particular situation or to particular needs without departing from the intended scope of the application. It is intended that the application not be limited to the particular example implementations and example embodiments described herein, but that the claims be given their broadest reasonable interpretation to cover all novel and non-obvious embodiments, literal or equivalent, disclosed or not, covered thereby.

What is claimed is:

1. A protective storage system for a vehicle comprising:
a flexible outer wall configured to form an inner chamber sized to receive the vehicle, said flexible outer wall including:
a flexible inner layer comprising an insulator, and
a flexible conducting layer comprising a conductor configured to dissipate an electric field;
a base configured to spread a bottom portion of the flexible outer wall to form a horizontal shape of said inner chamber;
a mounting structure configured to hold a portion of said flexible outer wall above the base to form a vertical shape of said inner chamber, wherein
said flexible outer wall is configured with a closable opening at one end such that the inner chamber protects the vehicle inside the chamber from damage by the electric field when said opening is closed.

2. The system of claim 1, wherein the flexible outer wall further comprises a flexible outer layer comprising an insulator.

3. The system of claim 1, wherein said conducting layer is a metal foil.

4. The system of claim 1, wherein said conducting layer includes a conducting mesh or cloth.

5. The system of claim 1, wherein said vehicle is a motorbike or ATV.

6. The system of claim 1, wherein said vehicle is an automobile.

7. The system of claim 1, wherein said mounting structure includes a spreader for spreading a top of the flexible outer wall to form an upper portion of said chamber.

8. The system of claim 1, wherein said mounting structure includes a spreader for spreading a top of the flexible outer wall to an upper portion of form said chamber.

9. The system of claim 8, wherein at least a portion of said mounting structure is provided outside of said flexible outer wall.

10. The system of claim 1, wherein at least a portion of said mounting structure is provided outside of said flexible outer wall.

11. A protective storage system for a vehicle comprising:
a flexible outer wall configured to form an inner chamber sized to receive the vehicle, said flexible outer wall including:

a flexible inner layer comprising an insulator,
a flexible conducting layer comprising a conductor configured to dissipate an electric field, and
a flexible outer layer comprising an insulator;
a base configured to spread a bottom portion of the flexible outer wall to form a horizontal shape of said inner chamber;
a mounting structure configured to hold a portion of said flexible outer wall above the base to form a vertical shape of said inner chamber, said mounting structure including a spreader for spreading a top of the flexible outer wall to form an upper portion of said chamber, wherein
said flexible outer wall is configured with a closable opening at one end such that the inner chamber protects the vehicle inside the chamber from damage by the electric field when said opening is closed.

12. The system of claim 11, wherein said flexible inner layer, said insulating layer, and said flexible outer layer are laminated together to form an integrated outer wall.

13. The system of claim 11, wherein said conducting layer is a metal foil.

14. The system of claim 11, wherein said conducting layer includes a conducting mesh or cloth.

15. The system of claim 11, wherein said vehicle is a motorbike or ATV.

16. The system of claim 11, wherein said vehicle is an automobile.

17. The system of claim 11, wherein at least a portion of said mounting structure is provided outside of said flexible outer wall.

18. A method of protecting a vehicle from an electromagnetic field, comprising the steps of:
providing a protective storage system for a vehicle comprising:
an outer wall configured to form an inner chamber sized to receive the vehicle, said outer wall including: a flexible inner layer comprising an insulator, and a conducting layer comprising a conductor configured to dissipate an electric field, wherein said outer wall is configured with a closable opening at one end;
placing said vehicle within said chamber;
closing said opening; and
protecting said vehicle from the electromagnetic field while the vehicle is within said chamber.

19. The method of claim 18, wherein said out wall is flexible and further comprises an outer layer comprising an insulator.

20. The method of claim 18, wherein said vehicle is placed within said chamber by driving or riding said vehicle within said chamber.

* * * * *